US 9,935,231 B2

(12) United States Patent
Roehrer

(10) Patent No.: US 9,935,231 B2
(45) Date of Patent: Apr. 3, 2018

(54) SEMICONDUCTOR ELEMENT WITH A SINGLE PHOTON AVALANCHE DIODE AND METHOD FOR MANUFACTURING SUCH SEMICONDUCTOR ELEMENT

(71) Applicant: ams AG, Unterpremstaetten (AT)

(72) Inventor: Georg Roehrer, Lebring-Sankt Margarethen (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/428,070

(22) Filed: Feb. 8, 2017

(65) Prior Publication Data
US 2017/0229598 A1 Aug. 10, 2017

(30) Foreign Application Priority Data
Feb. 9, 2016 (EP) .................................... 16154801

(51) Int. Cl.
*H01L 31/107* (2006.01)
*H01L 31/0352* (2006.01)
(Continued)

(52) U.S. Cl.
CPC .............. *H01L 31/107* (2013.01); *G01T 1/24* (2013.01); *H01L 27/146* (2013.01); *H01L 31/035272* (2013.01); *H01L 31/1864* (2013.01)

(58) Field of Classification Search
CPC ........... H01L 31/035272; H01L 31/107; H01L 31/1864
See application file for complete search history.

(56) References Cited

U.S. PATENT DOCUMENTS

| 4,651,187 A | 3/1987 | Sugimoto et al. |
| 6,541,836 B2 * | 4/2003 | Iwanczyk ......... H01L 27/14601 257/429 |

(Continued)

FOREIGN PATENT DOCUMENTS

| JP | H01115168 A | 5/1989 |
| WO | 2008129433 A2 | 10/2008 |

OTHER PUBLICATIONS

Veerappan, C. et al., "A Substrate Isolated CMOS SPAD Enabling Wide Spectral Response and Low Electrical Crosstalk", IEEE Journal of Selected Topics in Quantum Electronics, vol. 20, No. 6, 2014, 7 pgs.

(Continued)

*Primary Examiner* — Allan R Wilson
(74) *Attorney, Agent, or Firm* — McDermott Will & Emery LLP

(57) ABSTRACT

A method for manufacturing a semiconductor element comprising a single photon avalanche diode having a multiplication zone (AR) a guard ring structure with a second type of electrical conductivity comprises providing a semiconductor wafer with a first region (R) comprising a semiconductor material with the first type of conductivity. The method further comprises generating by a first doping process a first well (W1) of the guard ring structure having a first vertical depth, the first well (W1) laterally surrounding the multiplication zone (AR) and having a lateral distance (A) from the multiplication zone (AR). The method further comprises generating by a second doping process a second well (W2) of the guard ring structure having a second vertical depth, the second well (W2) laterally surrounding and adjoining a part of the first region for laterally defining the multiplication zone (AR).

7 Claims, 2 Drawing Sheets

(51) Int. Cl.
　　　*H01L 31/18*　　　(2006.01)
　　　*G01T 1/24*　　　(2006.01)
　　　*H01L 27/146*　　(2006.01)

(56) References Cited

U.S. PATENT DOCUMENTS

| | | | | |
|---|---|---|---|---|
| 8,217,436 | B2* | 7/2012 | Henderson | H01L 31/107 257/292 |
| 8,471,293 | B2* | 6/2013 | Sanfilippo | H01L 27/1446 257/186 |
| 8,766,164 | B2* | 7/2014 | Sanfilippo | H01L 31/1075 250/214.1 |
| 8,778,721 | B2* | 7/2014 | Sanfilippo | H01L 27/14643 438/380 |
| 8,835,975 | B1* | 9/2014 | Veeramma | H01L 29/0684 257/107 |
| 9,209,320 | B1 | 12/2015 | Webster | |
| 2006/0186501 | A1 | 8/2006 | Ishimura | |
| 2006/0192086 | A1* | 8/2006 | Niclass | H01L 31/107 250/214.1 |
| 2009/0184317 | A1* | 7/2009 | Sanfilippo | H01L 27/1446 257/49 |
| 2009/0184384 | A1* | 7/2009 | Sanfilippo | H01L 27/14643 257/432 |
| 2010/0148040 | A1* | 6/2010 | Sanfilippo | H01L 31/1075 250/214.1 |
| 2010/0271108 | A1* | 10/2010 | Sanfilippo | H01L 31/107 327/502 |
| 2011/0272561 | A1* | 11/2011 | Sanfilippo | H01L 27/1446 250/214.1 |
| 2014/0191115 | A1 | 7/2014 | Webster et al. | |

OTHER PUBLICATIONS

Fishburn, M., et al., "Reduction of Fixed-Position Noise in Position-Sensitive Single-Photon Avalanche Diodes", IEEE Transactions on Electron Devices, vol. 58, Issue 8, 2011, pp. 1-8.

Niclass, C., "Single-Photon Image Sensors in CMOS: Picosecond Resolution for Three-Dimensional Imaging", Ecole Polytechnique Federale de Lausanne, Suisse 2008, 262 pgs.

* cited by examiner

SEMICONDUCTOR ELEMENT WITH A SINGLE PHOTON AVALANCHE DIODE AND METHOD FOR MANUFACTURING SUCH SEMICONDUCTOR ELEMENT

BACKGROUND OF THE INVENTION

The invention relates to semiconductor elements, in particular with a single photon avalanche diode, and a method for manufacturing a semiconductor element with a single photon avalanche diode.

Single photon avalanche diodes, SPADs, are photo diodes being reverse biased above the breakdown voltage. Photons of incident electromagnetic radiation such as light may generate free carriers in a multiplication zone of the SPAD and thus trigger an avalanche current of the reverse biased p-n junction of the SPAD. In this way, the incident radiation may be detected.

When an avalanche current is triggered by carriers generated thermally or through tunneling, a dark count event occurs. Dark count events may occur randomly. The number of dark count events per area in a certain time period may be denoted dark count rate, DCR, and is an important performance parameter for SPADs. Since dark count events increase the internal noise, a low DCR is desired.

Another key parameter of SPADs is photon detection probability, PDP, being the probability of obtaining a successful detection when a photon hits the SPAD. To initiate a photon triggered avalanche current, the electric field in the multiplication zone must exceed a critical field for avalanche multiplication. A high PDP is desired to increase the sensitivity and accuracy of the SPAD.

SUMMARY OF THE INVENTION

According to the improved concept a guard structure, in particular a guard ring structure, surrounding a multiplication zone of a SPAD is utilized. The guard ring structure has a first and a second well consisting of regions with the same type of electrical conductivity. The first and the second well are manufactured by respective separate doping processes. The second well laterally defines the multiplication zone. For example, the second well may be denoted a shallow well and the first well may be denoted a deep well. The first well has a zero or nonzero lateral distance from the multiplication zone.

The multiplication zone corresponds to a region of the SPAD, in particular a region within a depletion region of the SPAD or being a part of the depletion region, where a single photon-generated carrier may initiate an avalanche breakdown provided the electrical field within the multiplication zone exceeds the critical field for avalanche multiplication. Within the multiplication zone, a breakdown voltage, in particular a breakdown voltage for avalanche multiplication, or a critical field for avalanche multiplication is for example constant or substantially constant.

In the described way, a transition zone at an inner edge of the guard ring structure may be reduced leading to an increased photon detection probability, PDP. The transition zone corresponds to a region where the breakdown voltage is increased with respect to the multiplication zone. Consequently, depending on a voltage applied to the SPAD, avalanche multiplication may be not possible in the transition zone when avalanche multiplication is still possible in the multiplication zone. Consequently, a reduction of the size of the transition zone may result in an improved PDP of the SPAD. In particular, the PDP may be increased since a smaller transition zone may cause a larger multiplication zone.

Furthermore, an electric field exceeding a critical field for avalanche multiplication outside the multiplication zone may be avoided leading to an increased PDP and/or decreased dark count rate, DCR.

According to the improved concept a method for manufacturing a semiconductor element comprising a SPAD is provided. The SPAD has a multiplication zone and a guard ring structure, the guard ring structure having a second type of electrical conductivity. The method comprises providing a semiconductor wafer with a first region comprising a semiconductor material with a first type of electrical conductivity.

The method further comprises generating by means of a first doping process a first well of the guard ring structure having a first vertical depth, the first well laterally surrounding the multiplication zone and having a lateral distance from the multiplication zone. The method further comprises generating by means of a second doping process a second well of the guard ring structure having a second vertical depth, the second well laterally surrounding and adjoining a part of the first region for laterally defining the multiplication zone.

The first and the second types of electrical conductivity are opposite types of electrical conductivity. That is, if the first type of electrical conductivity is n-type or electron conductivity, the second type of electrical conductivity is p-type or hole conductivity and vice versa.

The first region of the semiconductor wafer may for example be a part of a substrate of the semiconductor wafer or a doped region, for example a doped well, within the substrate.

According to some implementations, the first vertical depth is greater than the second vertical depth. According to alternative implementations, the first vertical depth is less than the second vertical depth, equal to the second vertical depth or essentially equal to the second vertical depth.

According to some implementations the semiconductor wafer comprises a semiconductor substrate with the second type of electrical conductivity and the first region is a doped region within the semiconductor substrate.

The first and the second well both have the second type of electrical conductivity. To this end, dopants used for the first and the second doping process are selected accordingly.

The semiconductor wafer has a surface, in particular a top surface, extending within a principal plane of the semiconductor wafer. "Top surface" refers to a surface on a side of the wafer from which the first and the second doping process, in particular dopants, are applied. Consequently, "vertical" refers to directions perpendicular to the principal plane. Therefore, the vertical depths of the first and the second well specify an extension of the wells into the wafer perpendicular to the top surface. Furthermore, "laterally" refers to directions parallel to the principal plane.

It is pointed out that the expression "ring" in "guard ring structure" means that the guard ring structure, in particular the first and the second well, laterally surrounds the multiplication zone viewed from a direction perpendicular to the principal plane. However, it does not necessarily imply that the guard ring structure or the wells have forms of circular rings viewed from that direction. Circular rings are a possible geometrical form, but also a polygonal, in particular with rotational symmetry, rectangular or square shape or such a shape with rounded or slanted edges may be suitable.

According to some implementations, the multiplication zone is laterally defined by the part of the first region surrounded and adjoined by the second well.

According to some implementations, the second doping process is performed after or later than the first doping process. In particular, one or more intermediate process steps for manufacturing the semiconductor element may be performed after the first doping process and before the second doping process.

According to some implementations, the first and the second well are arranged or embedded within the first region of the semiconductor wafer.

According to some implementations, lateral extensions of the first and the second well overlap at least partially. In particular, a lateral extension of the first well may lie completely within a lateral extension of the second well.

A SPAD of a semiconductor element manufactured by means of a method according to the improved concept may more effectively restrict an electric field beyond the critical field for avalanche multiplication to the multiplication zone by using a combination of the first and the second well for forming the guard ring structure. Consequently, it may be avoided that an electric field outside of the multiplication zone exceeds the critical field. Thus, the DCR may be reduced.

According to some implementations, the lateral distance is nonzero. In such implementations, the first well does not adjoin the multiplication zone laterally.

According to some implementations a gradient of dopant concentration, in particular a lateral gradient of dopant concentration, of the second well at an edge, in particular an inner edge, facing the multiplication zone is greater than a gradient of dopant concentration, particular a lateral gradient of dopant concentration, of the first well at an edge, in particular an inner edge, facing the multiplication zone. For example, the dopant concentration of the second well at its inner edge facing the multiplication zone decays steeper than the dopant concentration of the first well at its inner edge facing the multiplication zone.

The different lateral gradients may origin for example from the fact that the second well is generated at a time after the generation of the first well. Therefore, a thermal budget of the first well may be greater than a thermal budget of the second well. The increased thermal budget of the first well may for example origin from the intermediate process steps between the first and the second doping process, which may include high-temperature processes.

Therefore, implementations where the lateral distance is nonzero may have the particular advantage that an effective lateral size of the multiplication zone may be increased due to the greater concentration gradient of the second well. For example, a size of a transition zone with increased breakdown voltage compared to the multiplication zone at an inner edge of the guard ring structure or an outer edge of the multiplication zone may be reduced or avoided. This may lead to an increased PDP. At the same time, it may be avoided that the electric field exceeds the critical field outside the guard ring structure, which may decrease DCR.

According to some implementations, the first doping process comprises at least one ion implementation step and the second doping process comprises at least one second ion implantation step.

In particular, the first doping process may comprise two or more ion implementation steps using for example different process parameters such as implantation energy, implantation angle and/or implementation dose. The same holds for the second doping process.

According to some implementations, the method further comprises at least one thermal annealing step performed after the first doping process as before the second doping process.

Therefore, after finishing the manufacturing process, the dopants implanted during the first implantation step have seen an increased thermal budget compared to the dopants implanted during the second implementation step. Consequently, the dopants implanted during the first implantation step are subject to increased diffusion, in particular lateral diffusion and vertical diffusion, compared to the dopants implanted during the second implementation step. This may for example lead to an increased diffusion of dopants implanted during the first implantation step in a direction towards the multiplication zone compared to the diffusion towards the multiplication zone of dopants implanted during the second implementation step.

Therefore, in implementations where the lateral distance is nonzero, and consequently the first well does not adjoin the multiplication zone, a diffusion of dopants into the multiplication zone, a size of the transition zone, and therefore a reduction of the effective lateral size of the multiplication zone may be reduced or avoided. This may lead to an increased PDP together with a decreased DCR as described above.

According to some implementations, the lateral distance is zero. In such implementations, the first well laterally adjoins the multiplication zone.

The at least one thermal annealing step may for example be comprised by the intermediate process steps described above.

According to some implementations, the at least one thermal annealing step is comprised by a thermal oxidation process and/or by a shallow trench isolation, STI, process.

Since the thermal oxidation is performed at increased process temperatures, it may represent or partially represent the thermal annealing step.

The thermal oxidation process may for example be a process for generating a field oxide for separating, in particular electrically isolating, different electric components of the semiconductor element from each other.

Alternatively or in addition, the STI may be used to separate, in particular to electrically isolate, different electric components of the semiconductor element from each other.

The STI process may for example comprise one or more thermal steps performed at increased temperature for example including an oxidation process, in particular a liner oxidation process. The one or more thermal steps and/or the oxidation process of the STI process may represent or partially represent the thermal annealing step.

According to some implementations, a second total dose of dopants implanted by the at least one second ion implementation step is greater than a first total dose of dopants implanted by the at least one first ion implantation step.

Since the second total dose is greater than the first total dose, an average concentration and/or a maximum concentration of dopants in the second well may be greater than in the first well.

According to some implementations, the method comprises generating by means of a third doping process a first top region for contacting the multiplication zone having the second type of electrical conductivity, wherein the first top region is arranged on top of the multiplication zone.

Herein, "arranged on top of the multiplication zone" means arranged on a top side of the multiplication zone. The top side of the multiplication zone is a side of the multiplication zone facing or being part of the top surface of the semiconductor wafer.

The first top region may for example cover, in particular fully cover, the multiplication zone, in particular the top side of the multiplication zone. Optionally, the first top region may cover or partially cover the first and/or the second well.

The first top region serves for example for establishing a first electrical contact terminal of the SPAD. To this end, contacts, for example metal contacts, may be arranged on the first top region. In this way, a first electrode of the SPAD, which is an anode or a cathode of the SPAD depending on the first and second type of electrical conductivity, may be contacted. The first electrode is for example formed by the first top region, the first well and the second well.

According to some implementations, the method further comprises generating by means of a fourth doping process a further well having the first type of electrical conductivity, the further well laterally surrounding the multiplication zone and the guard ring structure, in particular the first and the second well.

According to some implementations, the further well and the guard ring structure are laterally separated by a further lateral distance.

According to some implementations, the further well is arranged or embedded within the first region of the semiconductor wafer. The further well has for example a greater dopant concentration than the first region.

According to some implementations, the method comprises generating by means of a fifth doping process a second top region having the first type of electrical conductivity, wherein the second top region is arranged on top of the further well.

Herein, "arranged on top of the further" means arranged on a top side of the further well. The top side of the further well is a side of the further well facing or being part of the top surface of the semiconductor wafer.

The second top region serves for example for establishing a second electrical contact terminal of the SPAD. To this end, contacts, for example metal contacts, may be arranged on the second top region. In this way, the a second electrode of the SPAD, which is a cathode or an anode of the SPAD depending on the first and second type of electrical conductivity, may be contacted. The second electrode is for example formed by the second top region, the further well and the first region.

If the first type of electrical conductivity is n-type, the first top region may form together with the first and the second well an anode or p-contact of the SPAD, while the second top region may form together with the further well and the first region a cathode or n-contact of the SPAD. The opposite holds in case the first type of electrical conductivity being p-type.

It is noted that the third doping process may be carried out before or after the fourth and/or the fifth doping process. Furthermore, the third, the fourth and/or the fifth doping process may be carried out before or after the first and/or the second doping process.

According to some implementations, the semiconductor element further comprises at least one field effect transistor.

The at least one field effect transistor comprises for example one or more MOS field effect transistors, FETs, and/or one or more power-MOSFETs also denoted as high-voltage-MOSFETs.

According to some implementations, the method comprises generating at least one doped region of the at least one field effect transistor by means of a process comprising the first doping process and/or the second doping process and/or the fourth doping process.

According to some implementations, the semiconductor element comprises a supply circuit, for example a charge pump circuit, in particular a high-voltage charge pump circuit, for supplying a reverse bias voltage to the SPAD. The at least one FET is for example comprised by the supply circuit.

According to some implementations, a first doped region of a first FET of the at least one FET is generated by means of a process comprising the first doping process. A second doped region of a second FET of the at least one FET is generated by means of a process comprising the second doping process.

If the first FET is a power-MOSFET, the first doped region of the first FET may for example correspond to a drift region or a body region of the first FET. If the second FET is a MOSFET but not a power MOSFET, the first doped region of the first FET may for example correspond to a body region of the first FET.

If the second FET is a power-MOSFET, the second doped region of the second FET may for example correspond to a drift region or a body region of the second FET. If the second FET is a MOSFET but not a power MOSFET, the second doped region of the second FET may for example correspond to a body region of the second FET.

According to some implementations, a third doped region of a third FET of the at least one FET is generated by means of a process comprising the fourth doping process.

If the third FET is a power-MOSFET, the third doped region of the third FET may for example correspond to a drift region or a body region of the third FET. If the third FET is a MOSFET but not a power MOSFET, the third doped region of the third FET may for example correspond to a body region of the second FET.

According to the improved concept also a semiconductor element is provided. The semiconductor element comprises a SPAD with a multiplication zone and a guard ring structure, the guard ring structure having a second type of electrical conductivity. The guard ring structure comprises a first well having a first vertical depth, the first well laterally surrounding the multiplication zone and having a lateral distance from the multiplication zone. The guard ring structure further comprises a second well having a second vertical depth, the second well laterally defining the multiplication zone by laterally surrounding and adjoining the multiplication zone.

According to some implementations of the semiconductor element, the first well has a first dopant distribution and the second well has a second dopant distribution. The first and the second dopant distribution correspond to a first doping process for generating the first well, a second doping process for generating the second well and at least one thermal annealing step performed after the first doping process and before the second doping process.

The first doping process comprises at least one first ion implantation step and the second doping process comprises at least one second ion implantation step.

Performing the at least one thermal annealing step between the first and the second doping process leads, due to the increased thermal budget of the first well, to an increased diffusion of the dopants of the first well, in particular lateral diffusion and vertical diffusion, compared to the dopants of the second well. Thus, a dopant concentration of the second well at an edge facing the multiplication zone decays steeper than a dopant concentration of the first well at an edge facing the multiplication zone. For further details, it is referred to the respective explanations with respect to the method according to the improved concept above.

According to some implementations of the semiconductor element, a second dopant concentration of the second well, for example a second average dopant concentration and/or a second maximum dopant concentration of the second well, is greater than a first dopant concentration of the first well, for example a first average dopant concentration and/or a first maximum dopant concentration of the first well.

Further implementations of the semiconductor element are readily derived from the various implementations and embodiments of the method according to the improved concept and vice versa.

In the following, the improved concept is explained in detail with the aid of exemplary implementations by reference to the drawings. Components that are functionally identical or have an identical effect may be denoted by identical references. Identical components and/or components with identical effects may be described only with respect to the figure where they occur first. Their description is not necessarily repeated in subsequent figures.

DETAILED DESCRIPTION

Figure 1A:
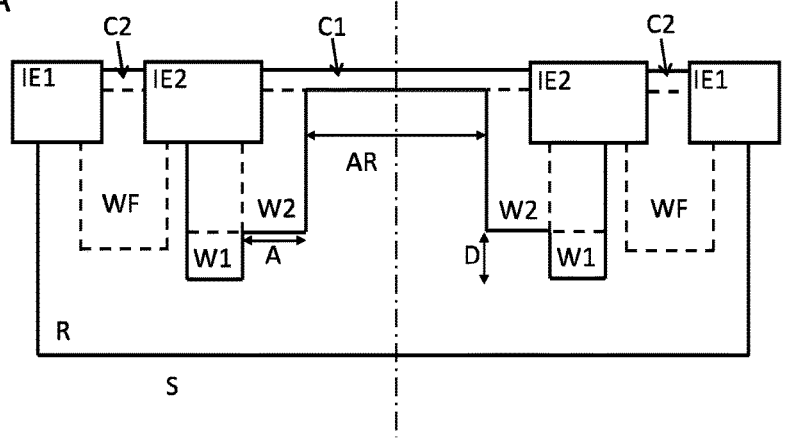
FIG. 1A shows a schematic view of a cross-section of an exemplary implementation of a semiconductor element according to the improved concept.

FIG. 1A shows a schematic view of a cross-section of a semiconductor element with a single photon avalanche diode, SPAD, according to the improved concept. The semiconductor element is manufactured by means of a method according to the improved concept.

The SPAD is for example rotational symmetric with respect to a rotation axis shown in FIG. 1A by a vertical dash-dotted line. The rotational symmetry may be continuous, that is a circular symmetry, or may be discrete, for example a 4-fold rotational symmetry.

The semiconductor element comprises a semiconductor wafer or die with a semiconductor substrate S. The semiconductor element, in particular the SPAD, further comprises a doped region R having a first type of electrical conductivity, for example n-type conductivity. The semiconductor substrate S has a second type of electrical conductivity which is opposite to the first type of conductivity, for example p-type conductivity. In alternative implementations, the semiconductor substrate S has the first type of conductivity and forms the doped region R.

The SPAD comprises a guard ring structure formed by a first doped well W1 and a second doped well W2 within the doped region R. The first and the second well W1, W2 both have the second type of conductivity.

The second well W2 surrounds and adjoins a part of the doped region R. In this way a multiplication zone AR of the SPAD is formed and defined laterally. The multiplication zone AR corresponds to a region of the SPAD, where a single photon-generated carrier may initiate an avalanche breakdown provided the electrical field within the multiplication zone exceeds the critical field for avalanche multiplication. Within the multiplication zone AR an avalanche breakdown voltage or a critical field for avalanche multiplication may be constant or substantially constant.

The first well W1 surrounds the multiplication zone AR having for example a nonzero lateral distance A from the multiplication zone AR and correspondingly from an inner edge of the second well W2. In particular, the first well W1 does for example not directly adjoin the multiplication zone AR. In alternative implementations, the lateral distance A is zero.

The first well W1 and the second well W2 may overlap laterally. For example, an outer edge of the first well W1 may lie within the second well W2 or the outer edges of the first and the second well W1, W2 may lie at the same or approximately the same lateral position, as shown in FIG. 1A. In alternative implementations, the first well W1 may lie completely or partially outside of the second well W2.

The first well W1 has for example a vertical depth that exceeds the vertical depth of the second well W2 by a vertical difference D. In alternative implementations, the vertical depth of the second well W2 may exceed the vertical depth of the first well W1 or be equal to the vertical depth of the first well W1. A dopant concentration, for example on average or maximum dopant concentration, of the second well W2 may for example be greater than a dopant concentration of the first well W1.

The SPAD further comprises a first top region C1 having the second type of conductivity within the doped region R. The first top region C1 is arranged on top of the multiplication zone AR and covers the multiplication zone AR to provide an electrical contact, for example an external electrical contact, of the SPAD. The first top region C1 may cover or partially cover the second well W2 as shown in FIG. 1A. Depending on the lateral distance A, the first top region C1 may for example also cover or partially cover the first well W1. For example, if the second type of conductivity is p-type, the first top region C1 may form together with the first and the second well W1, W2 an anode of the SPAD.

A dopant concentration of the first top region C1 may for example be greater than a dopant concentration of the first well W1 and/or of the second well W2.

The SPAD further comprises a further doped well WF within the doped region R. The further well WF has the first type of conductivity. A dopant concentration of the further well WF may for example be greater than a dopant concentration of the doped region R. The further well WF laterally surrounds the multiplication zone AR and the guard ring structure and has for example a further lateral distance from the first and/or the second well.

The SPAD further comprises a second top region C2 having the first type of conductivity within the doped region R. The second top region C2 is arranged on top of the further well WF to provide an electrical contact, for example an external electrical contact, of the SPAD. For example, if the first type of conductivity is n-type, the second top region C2 may form together with the further well WF and the doped region R a cathode of the SPAD. A dopant concentration of the second top region C2 may for example be greater than a dopant concentration of the further well WF.

The SPAD further comprises for example a first isolation element IE1, for example a field oxide or a shallow trench isolation, STI, laterally surrounding the multiplication zone AR, the first and the second well W1, W2 and at least partially the further well WF. The first isolation element IE1 for example isolates the SPAD from further electronic components of the semiconductor element. The first isolation element IE1 may for example partially overlap with the further well WF.

In particular, the semiconductor element may comprise further SPADs that are implemented analogously to the SPAD shown in FIG. 1A. Several SPADs of the semiconductor element may for example be arranged in a SPAD array. Neighboring SPADs of the SPAD array may for example be electrically isolated by the first isolation element IE1. In some implementations, neighboring SPADs of the SPAD array may share parts of the further well WF and the second top region C2. For example, a SPAD arranged left to the SPAD shown in FIG. 1A may share respective parts of the further well WF and the second top region C2 arranged left to the vertical dashed line.

The SPAD may for example further comprise a second isolation element IE2 arranged laterally between top regions C1, C2 for example for electrically isolating them from each other. The second isolation element IE2 is for example implemented as the field oxide or the STI. The second isolation element IE2 may for example partially overlap with the further well WF, the first well W1 and/or the second well W2. It is highlighted that the second isolation element IE2 is optional.

The further well WF and the doped region R are for example generated by means of respective further doping processes, each including at least one further ion implantation step.

The first well W1 is generated by means of a first doping process involving at least one first ion implementation step and the second well is generated by means of a second doping process involving at least one second ion implementation step. During manufacturing, a thermal annealing step is carried out after the first doping process and before the second doping process. The thermal annealing step may for example be used to generate the first isolation element IE1 and/or the second isolation element IE2. In particular, the thermal annealing step may comprise a thermal oxidation step for example for generating the field oxide or the STI.

Due to this process sequence, the second well W2 does not see the thermal annealing step in contrast to the first well W1. In other words, a thermal budget of the first well W1 is greater than a thermal budget of the second well W2. This may lead to an increased diffusion of dopants of the first well W1 compared to dopants of the second well W2. An optional greater vertical depth of the first well W1 compared to the second well W2 may for example partially origin from this increased diffusion. Another contribution to the optional increased vertical depth of the first well W1 may be due to different process parameters of the first and second implantation steps, in particular higher implantation energies of the first implantation steps and/or different implantation angles.

In operation, the SPAD may for example be reverse biased above a breakdown voltage of a pn-junction formed by the first top region C1, the doped region R, the further well WF and the second top region C2. Provided the reverse bias is strong enough to generate an electric field within the multiplication zone AR that exceeds the critical field for avalanche multiplication, photons incident on the SPAD, in particular the multiplication zone AR, may trigger an avalanche current based on which the photon incidence may be detected by means of the SPAD.

Due to the greater thermal budget of the first well W1, also a lateral diffusion of dopants of the first well W1 is more pronounced than a lateral diffusion of dopants of the second well W2. Consequently, a nonzero lateral distance A of the first well W1 from the multiplication zone AR has the effect of a reduced out-diffusion of dopants from the guard ring structure into the multiplication zone AR. Such out-diffusion may decrease an effective size of the multiplication zone AR by generating or increasing a transition zone with increased breakdown voltage compared to the multiplication zone at inner edges of the guard ring structure or outer edges of the multiplication zone, respectively. Thus, by means of a SPAD according to the improved concept, in particular with a nonzero lateral distance A, the transition zone may be reduced or avoided, which may result in an increased photon detection probability, PDP.

On the other hand, using both the first well W1 and the second well W2 for the guard ring structure may lead to a better guarding or screening of the electrical field with respect to a region of the SPAD outside of the guard ring structure. In particular, the first well W1 may more efficiently prevent from electric fields outside of the multiplication zone AR exceeding the critical field. In this way the PDP may be increased and/or a dark count rate, DCR, of the SPAD may be reduced.

Note that, due to the rotational symmetry of the SPAD, the respective parts of the wells W1, W2, WF, the second top region C2 and the isolation elements IE1, IE2 on either side of the vertical dashed line are in fact connected to each other, respectively. In particular, viewed from a direction perpendicular to a top surface of the semiconductor wafer or die, said components or edges of said components may have for example the shapes of circular rings, rotationally symmetric polygons, rectangles or squares or such shapes with rounded or slanted edges.

It is further pointed out that the dimensions of components are not necessarily drawn to scale.

Figure 1B:
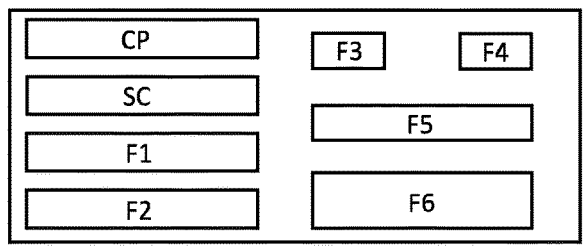
FIG. 1B shows a block diagram of a further exemplary implementation of a semiconductor element according to the improved concept.

FIG. 1B shows a block diagram of a further exemplary implementation of a semiconductor element according to the improved concept. The semiconductor element may for example be a semiconductor die, for example a time-of-flight sensor die for detecting a time-of-flight of electromagnetic radiation emitted by a light source and reflected by an object.

The semiconductor element comprises a SPAD circuit SC comprising a SPAD as described with respect to FIG. 1A or an array of such SPADs. Furthermore, the semiconductor element comprises a supply circuit CP, for example a charge pump, in particular a high-voltage charge pump, for supplying a reverse bias voltage to the SPAD or the SPADs of the SPAD array.

For the sake of explanation, it is assumed in the following that the first type of conductivity is n-type and the second type of conductivity is p-type. An adaption to the opposite case is straightforward for the skilled reader.

The supply circuit CP comprises for example a MOS circuitry including low-voltage or regular n-MOSFETs and p-MOSFETs as well as power n-MOSFETs and power p-MOSFETs. For the manufacturing of doped body regions of the regular and power MOSFETs as well as for a manufacturing of doped drift regions of the power MOSFETs, the first and the second doping process used for generating the first and the second well W1, W2 of the SPAD may be utilized. Optionally, also the further doping processes used for generating the further well WF and the doped region R may also be used for manufacturing said drift or body regions of the MOSFETs and/or power MOSFETs.

For example, the first and/or the second doping process may be used to manufacture body regions of regular n-MOSFETs. The first doping process may for example be used to manufacture drift regions of power p-MOSFETs. A first further doping process for manufacturing the further well WF and/or a second further doping process for manufacturing the doped region R may for example be used to manufacture body regions of regular p-MOSFETs. The first further doping process may for example be used to manufacture drift regions of power n-MOSFETs.

By using optimized high-voltage wells for manufacturing also the respective wells of the SPAD, a particularly efficient manufacturing of the semiconductor element may be achieved. Furthermore, for example by using a high-voltage optimized well for manufacturing the further well WF, a separation of the further well WF and the second top region C2 from the multiplication zone AR, namely a so-called high-voltage isolation overhead, may be reduced resulting in an increased fill factor of electronic components per die area.

The SPAD circuit SC may for example also comprise a quenching circuit, for example an active quenching circuit for controlling an operation of the SPAD or SPAD array.

Optionally, the semiconductor element may comprise further circuit elements F1 to F6. In case of a time-of-flight sensor die, the further circuit elements may for example include a reference SPAD circuit F1 comprising a reference SPAD that may be implemented as explained with respect to FIG. 1A or an array of such SPADs as well as a respective quenching circuit, for example an active quenching circuit. The further circuit elements may also comprise a time-to-digital converter F2, a random-access memory F3, a read-only memory F4, a microcontroller F5 and/or a laser diode driver F6.

Figure 2:
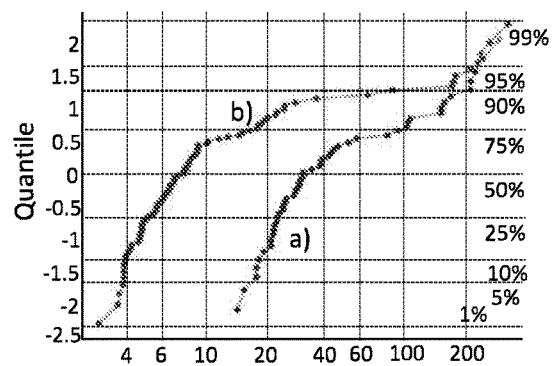
FIG. 2 shows a normal quantile plot of the dark count rate for semiconductor elements.

FIG. 2 shows a normal quantile plot of the DCR for semiconductor elements. The x-axis shows DCR in dark current events per second and $\mu m^2$. The y-axis shows the quantile.

The dots on curve a) correspond to measurement results of SPADs similar as described with respect to FIG. 1A. However, while the SPADs of curve a) have the second well W2, they do not have the first well W1 in contrast to SPADs according to the improved concept. The dots on curve b) correspond to measurement results of SPADs according to the improved concept as described with respect to FIG. 1A, that is having both the first and the second well W1, W2, with zero lateral distance A.

One can clearly see that the distribution for the SPADs according to the improved concept are shifted to significantly lower values for DCR. This DCR reduction origins from using a guard ring structure combining the first and the second well W1, W2 as described above, in contrast to using only the second well W2.

Figure 3:
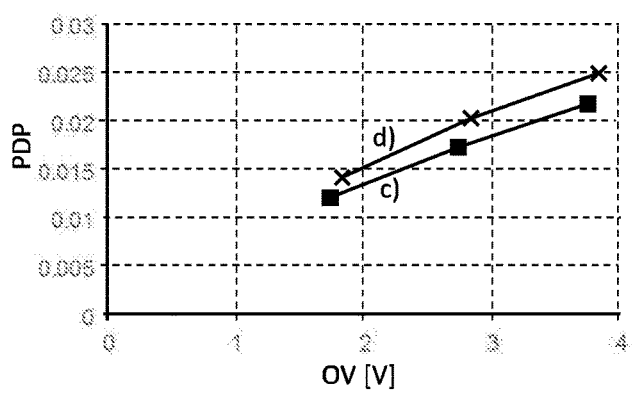
FIG. 3 shows a plot of the photon detection probability for semiconductor elements according to the improved concept.

FIG. 3 shows the photon detection probability for semiconductor elements, in particular for SPADs, according to the improved concept. The x-axis shows excess bias voltage OV applied to the SPAD in volts and the y-axis shows PDP. The excess bias voltage OV or over voltage corresponds to a difference between a voltage applied to the SPAD and a breakdown voltage for avalanche multiplication.

The squares on curve c) correspond to measurement results for a SPAD according to the improved concept as described with respect to FIG. 1A with zero lateral distance A. The crosses on curve d) correspond to measurement results for a SPAD according to the improved concept as described with respect to FIG. 1A with nonzero lateral distance A, for example with A=1.3 $\mu m$.

One can see that the PDP is significantly greater for the SPAD with nonzero A. This origins from the reduction or avoiding of the transition zone at the outer edges of the multiplication zone AR. This is achieved by placing the first well W1 with greater thermal budget and consequently greater out-diffusion of dopants remote from the multiplication zone AR.

Figure 4A:
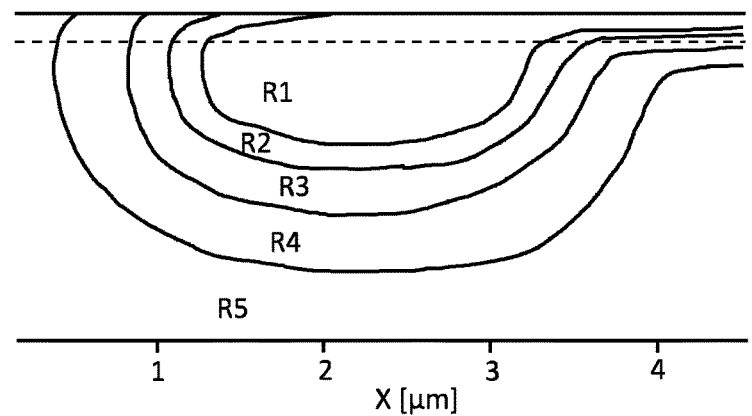
FIG. 4A shows schematically a dopant concentration distribution within a semiconductor element.
Figure 4B:
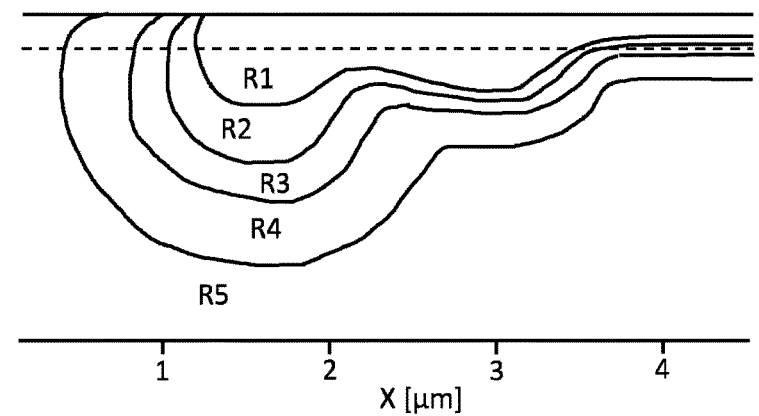
FIG. 4B shows schematically a dopant concentration distribution within a semiconductor element according to the improved concept.
Figure 4C:
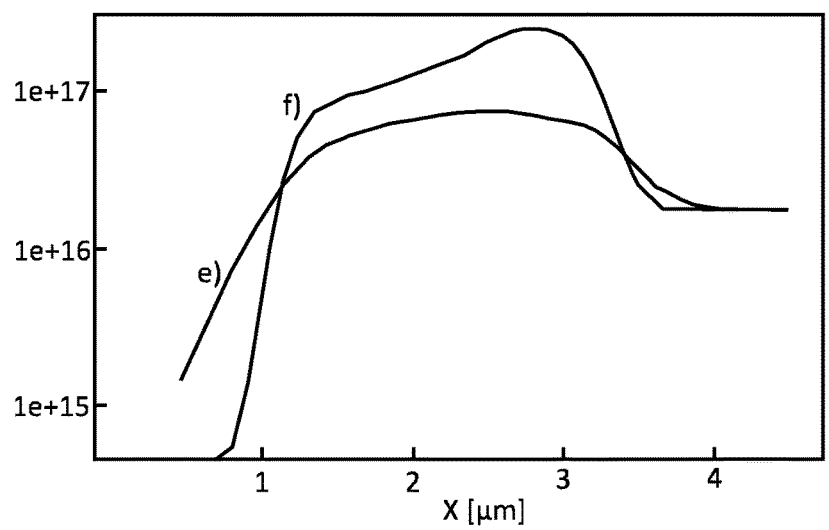
FIG. 4C shows the dopant concentration distribution of FIGS. 4A and 4B for a fixed vertical position.

FIGS. 4A to 4C show schematically distributions of dopant concentration within a semiconductor element, in particular within SPADs, in particular within a guard ring of SPADs. FIGS. 4A and 4B show cross-sections of SPADs.

FIG. 4A corresponds to simulation results of a SPAD similar as described with respect to FIG. 1A for zero lateral distance A. However, while the SPAD of FIG. 4A has the first well W1, it does not have the second well W2 in contrast to a SPAD according to the improved concept.

FIG. 4A shows regions R1 to R5 of different dopant concentration. The second type of electrical conductivity may for example be p-type and the dopants used for manufacturing the first well W1 may for example be boron atoms. The boron concentration may for example be largest in region R1 and gradually decrease through the regions R2 to R4 and be lowest in region R5. The x-axis shows a lateral position X in $\mu m$. The lines separating the regions R1 to R5 from each other correspond to or approximately correspond to constant dopant concentration. For further details, it is referred to FIG. 4C and the respective explanations below.

FIG. 4B corresponds to simulation results of a SPAD as described with respect to FIG. 1A according to the improved concept for nonzero lateral distance A.

FIG. 4B shows regions R1 to R5 of different the dopant concentration. The second type of electrical conductivity may for example be p-type and the dopants used for manufacturing the first well W1 and the second well W2 may for example be boron atoms. The boron concentration may for example be largest in region R1 and gradually decrease of the regions R2 to R4 and be lowest in region R5. The x-axis shows the lateral position X in $\mu m$. In contrast to FIG. 4A, the regions R1 to R5 are less symmetric in FIG. 4B due to the combination of the wells W1, W2.

The lines separating the regions R1 to R5 from each other correspond to lines with constant or approximately constant dopant concentration.

The shown parts where the regions R1 to R4 extend deeper into the semiconductor element in vertical direction, that is in the left part of FIG. 4B, correspond essentially to the first well W1. The parts where the regions R1 to R4 extend less into the semiconductor element in vertical direction and show a shoulder, that is in the middle part of FIG. 4B, correspond essentially to the second well W2. The parts where the regions R1 to R4 extend least into the semiconductor element in vertical direction and are essentially flat, that is in the right part of FIG. 4B, correspond essentially to multiplication zone AR and the first top region C1, respectively. For further details, it is referred to FIG. 4C and the respective explanations below.

FIG. 4C shows the boron concentration for the SPADs of FIGS. 4A and 4B for a fixed vertical depth have indicated by dashed horizontal lines in FIGS. 4A and 4B. The x-axis of FIG. 4C shows the lateral position X in $\mu m$ as in FIGS. 4A and 4B. The y-axis of FIG. 4C shows the boron atom concentration in $cm^{-3}$. Curve e) corresponds to the SPAD of FIG. 4A and curve f) corresponds to the SPAD according to the improved concept of FIG. 4B.

One can see that at the outer and inner edges of the guard ring structure, in particular at the inner edges of the guard ring structure corresponding to the outer edges of the multiplication zone AR, a gradient of the boron atom concentration is greater for curve f) than for curve e). Consequently, for curve f) corresponding to the SPAD according to the improved concept, less dopants have diffused into the multiplication zone AR. Thus, the transition zone of the multiplication zone AR is reduced or avoided by means of the improved concept.

By means of a semiconductor element with a SPAD according to the improved concept PDP and DCR may be improved by avoiding an electric field in the perimeter of the SPAD, that is outside of the multiplication zone AR, exceeding the critical field for avalanche multiplication. This is achieved by combining the first and the second well W1, W2 generated by separate doping processes. In addition, PDP may be further improved by reducing or avoiding the transition zone at an outer edge of the multiplication zone AR resulting from out-diffusion of dopants from the guard ring structure into the multiplication zone AR. This is in particular achieved by placing the first well W1 having a higher thermal budget remote from the multiplication zone AR.

We claim:

1. A method for manufacturing a semiconductor element comprising a single-photon avalanche diode with a multiplication zone having a first type of electrical conductivity, and a guard ring structure, the guard ring structure having a second type of electrical conductivity opposite the first type of electrical conductivity, the method comprising:
   providing a semiconductor wafer with a first region comprising a semiconductor material having the first type of electrical conductivity;
   performing a first doping process generating a first well of the guard ring structure having a first vertical depth, the first well laterally surrounding the multiplication zone and having a lateral distance from the multiplication zone;
   performing a second doping process generating a second well of the guard ring structure having a second vertical depth, the second well laterally surrounding and adjoining a part of the first region for laterally defining the multiplication zone; and
   generating a further well having the first type of electrical conductivity, the further well laterally surrounding the multiplication zone, the first well and the second well,
   wherein the first doping process comprises at least one first ion implantation step and the second doping process comprises at least one second ion implantation step, and
   wherein a second total dose of dopants implanted by the least one second ion implantation step is greater than a first total dose of dopants implanted by the at least one first ion implantation step.

2. A method for manufacturing a semiconductor element comprising a single-photon avalanche diode with a multiplication zone having a first type of electrical conductivity, and a guard ring structure, the guard ring structure having a second type of electrical conductivity opposite the first type of electrical conductivity, the method comprising:
   providing a semiconductor wafer with a first region comprising a semiconductor material having the first type of electrical conductivity;
   performing a first doping process generating a first well of the guard ring structure having a first vertical depth, the first well laterally surrounding the multiplication zone and having a lateral distance from the multiplication zone;
   performing a second doping process generating a second well of the guard ring structure having a second vertical depth, the second well laterally surrounding and adjoining a part of the first region for laterally defining the multiplication zone;
   generating a further well having the first type of electrical conductivity, the further well laterally surrounding the multiplication zone, the first well and the second well;
   performing a third doping process generating a first top region having the second type of electrical conductivity, the first top region being arranged on top of the multiplication zone;
   performing a fourth doping process generating the further well; and
   performing a fifth doping process generating a second top region having the first type of electrical conductivity, the second top region being arranged on top of the further well.

3. A method further for manufacturing a semiconductor element comprising a single-photon avalanche diode with a multiplication zone having a first type of electrical conductivity, and a guard ring structure, the guard ring structure having a second type of electrical conductivity opposite the first type of electrical conductivity, the method comprising:
   providing a semiconductor wafer with a first region comprising a semiconductor material having the first type of electrical conductivity;
   performing a first doping process generating a first well of the guard ring structure having a first vertical depth, the first well laterally surrounding the multiplication zone and having a lateral distance from the multiplication zone;
   performing a second doping process generating a second well of the guard ring structure having a second vertical depth, the second well laterally surrounding and adjoining a part of the first region for laterally defining the multiplication zone;
   generating a further well having the first type of electrical conductivity, the further well laterally surrounding the multiplication zone, the first well and the second well; and
   generating at least one doped region of at least one field effect transistor by the first and/or the second doping process.

4. The method according to claim 3, wherein
the at least one doped region of the at least one field effect transistor is generated by the first doping process; and
a second doped region of a second field effect transistor is generated by the second doping process.

5. A semiconductor element comprising:
a single-photon avalanche diode with a multiplication zone having a first type of electrical conductivity;
a guard ring structure having a second type of electrical conductivity opposite the first type of electrical conductivity;
a first well of the guard ring structure, the first well having a first vertical depth, the first well laterally surrounding the multiplication zone at a lateral distance from the multiplication zone;
a second well of the guard ring structure, the second well having a second vertical depth, the second well laterally defining the multiplication zone by laterally surrounding and adjoining the multiplication zone; and a further well having the first type of electrical conductivity, the further well laterally surrounding the multiplication zone, the first well and the second well, wherein the first well has a first dopant distribution, and the second well has a second dopant distribution, the first dopant distribution being different from the second dopant distribution, and wherein the second dopant distribution of the second well is greater than the first dopant distribution of the first well.

6. A semiconductor element comprising:

a single-photon avalanche diode with a multiplication zone having a first type of electrical conductivity;

a guard ring structure having a second type of electrical conductivity opposite the first type of electrical conductivity;

a first well of the guard ring structure, the first well having a first vertical depth, the first well laterally surrounding the multiplication zone at a lateral distance from the multiplication zone;

a second well of the guard ring structure, the second well having a second vertical depth, the second well laterally defining the multiplication zone by laterally surrounding and adjoining the multiplication zone;

a further well having the first type of electrical conductivity, the further well laterally surrounding the multiplication zone, the first well and the second well;

a first top region having the second type of electrical conductivity and being arranged on top of the multiplication zone; and a second top region having the first type of electrical conductivity, the second top region being arranged on top of the further well.

7. A semiconductor element comprising:

a multiplication zone of a first type of electrical conductivity;

a first well of a second type of electrical conductivity opposite the first type of electrical conductivity, the first well laterally surrounding the multiplication zone;

a first vertical depth of the first well;

a second well of the second type of electrical conductivity, the second well being arranged between the first well and the multiplication zone;

a second vertical depth of the second well, the second vertical depth being different from the first vertical depth;

a further well having the first type of electrical conductivity, the further well laterally surrounding the multiplication zone, the first well and the second well;

a first top region having the second type of electrical conductivity arranged on top of the multiplication zone; and a second top region having the first type of electrical conductivity arranged on top of the further well.

* * * * *